United States Patent
Reynolds et al.

(10) Patent No.: US 9,470,732 B2
(45) Date of Patent: Oct. 18, 2016

(54) COMPACT SPACECRAFT ANTENNA FIELD APERTURE LOAD COUPLER

(71) Applicant: The Boeing Company, Chicago, IL (US)

(72) Inventors: Robert L. Reynolds, Newbury Park, CA (US); James M. Barker, Torrance, CA (US); Robert Daniel Kerekes, Torrance, CA (US); Martin W. Bieti, Tujunga, CA (US)

(73) Assignee: The Boeing Company, Chicago, IL (US)

(*) Notice: Subject to any disclaimer, the term of this patent is extended or adjusted under 35 U.S.C. 154(b) by 239 days.

(21) Appl. No.: 14/273,329

(22) Filed: May 8, 2014

(65) Prior Publication Data
US 2015/0323581 A1 Nov. 12, 2015

(51) Int. Cl.
*H01Q 1/28* (2006.01)
*H01Q 13/02* (2006.01)
*G01R 29/10* (2006.01)

(52) U.S. Cl.
CPC ............ *G01R 29/10* (2013.01); *H01Q 1/288* (2013.01); *H01Q 13/02* (2013.01)

(58) Field of Classification Search
CPC ........ H01Q 1/28; H01Q 1/288; H01Q 3/267; H01Q 3/28; H01Q 3/44; H01Q 3/446; H01Q 13/00; H01Q 13/02–13/0258; H01Q 13/0266; H01Q 13/0275; H01Q 13/06; H01Q 13/065; H01Q 19/021; H01Q 21/29; H01Q 25/002; G01R 29/08; G01R 29/10
USPC .................................. 343/703, 786
See application file for complete search history.

(56) References Cited

U.S. PATENT DOCUMENTS

| | | | | |
|---|---|---|---|---|
| 3,863,405 A * | 2/1975 | Leiter | ...................... | H01Q 1/08 52/108 |
| 4,041,499 A * | 8/1977 | Liu | ...................... | H01Q 25/04 343/756 |
| 4,047,180 A * | 9/1977 | Kuo | ...................... | H01P 1/16 333/228 |
| 5,555,257 A * | 9/1996 | Dent | ...................... | H01Q 1/246 342/352 |
| 6,127,980 A * | 10/2000 | Podgorski | ........... | G01R 29/0828 343/703 |
| 6,518,853 B1 * | 2/2003 | O'Connell | ............. | H01P 5/024 333/21 R |
| 6,720,932 B1 * | 4/2004 | Flynn | ...................... | H01Q 5/47 333/21 A |
| 7,511,678 B2 * | 3/2009 | Wu | ...................... | H01Q 5/47 343/786 |
| 7,692,593 B2 * | 4/2010 | Rao | ...................... | G01R 29/10 343/703 |

OTHER PUBLICATIONS

Bundy et al.; "Anechoic Loads for the Inmarsat 3 Satellite Programme" The Institution of Engineers, Australia; $7^{th}$ National Space Engineering Symposium; Sep. 21-26, 1992; p. 95-100.

* cited by examiner

*Primary Examiner* — Sue A Purvis
*Assistant Examiner* — Patrick Holecek
(74) *Attorney, Agent, or Firm* — Baker & Hostetler LLP (57) ABSTRACT

An apparatus, method, and system are disclosed that can be used to reduce the peak radiated flux density of a horn antenna or for testing the electronics associated with a horn antenna. A horn antenna with narrow and wide ends can have disposed within it a surrogate waveguide. The surrogate waveguide has a wide end smaller than the wide end of the horn antenna, and the wide end of surrogate waveguide extending to or beyond the wide end of the horn antenna. A mounting plate or face plate covers a portion of the wide end of the horn antenna.

20 Claims, 11 Drawing Sheets

COMPACT SPACECRAFT ANTENNA FIELD APERTURE LOAD COUPLER

FIELD

This disclosure is directed toward the field of satellite microwave payload test equipment.

BACKGROUND

High powered horn antennas, such as those used in satellite communications, can produce a focused high flux density that creates challenges for testing the communication electronics attached to a horn antenna. To test attached electronics, one typical configuration includes a Radio Frequency (RF) absorber backed by an actively cooled aluminum plate which is positioned in front of the horn antenna. A thin aluminum shroud surrounding the space between the absorber and the horn antenna can be added to create a Field Aperture Load (FAL) configuration. Limits on the absorption and cooling rate of the FAL limit the maximum allowable flux density at the absorber pad. To reduce the flux density at the absorber pad, the absorber pad can be moved farther from the horn antenna such that the energy emitted from the horn is more diffuse and a sufficiently low maximum flux density is found. As the absorber pad moves further from the horn, the entire FAL, including the aluminum shroud, must grow.

Large test configurations can create increase costs and create other challenges, especially during Spacecraft Thermal Vacuum (SCTV) testing. SCTV testing is often required for satellite communication systems and it requires an entire test configuration to fit within a vacuum chamber. Large vacuum chamber testing facilities are generally expensive with limited schedule availability.

SUMMARY

Examples disclosed here include an apparatus, system and method for testing the electronics associated with a horn antenna. Some examples reduce the maximum flux density emitted and hence allow test equipment such as an RF absorbent pad to be closer to the antenna being tested and allow the entire FAL structure to be smaller. This simplifies the test configuration, and in particular allows use of smaller SCTV test chambers. In one example, a surrogate waveguide is slip-fit into the horn antenna being tested, with a smaller aperture horn attached to the end of the surrogate waveguide. This causes the energy emitted from the antenna to be more diffused and less focused, thereby reducing the maximum flux density at any particular distance from the antenna. An electric field probe (E-Probe) can be incorporated into the surrogate waveguide to detect or insert signals into the energy fields being transmitted or received by the antenna.

The features, functions, and advantages that have been discussed can be achieved independently in various examples or may be combined in yet other examples, further details of which can be seen with reference to the following description and drawings.

BRIEF DESCRIPTION OF DRAWINGS

The following detailed description may be better understood when read in conjunction with the appended drawings. For the purposes of illustration, various examples of aspects of the disclosure are shown in the drawings; however, the invention is not limited to the specific methods and instrumentalities disclosed.

DETAILED DESCRIPTION

Figure 1:
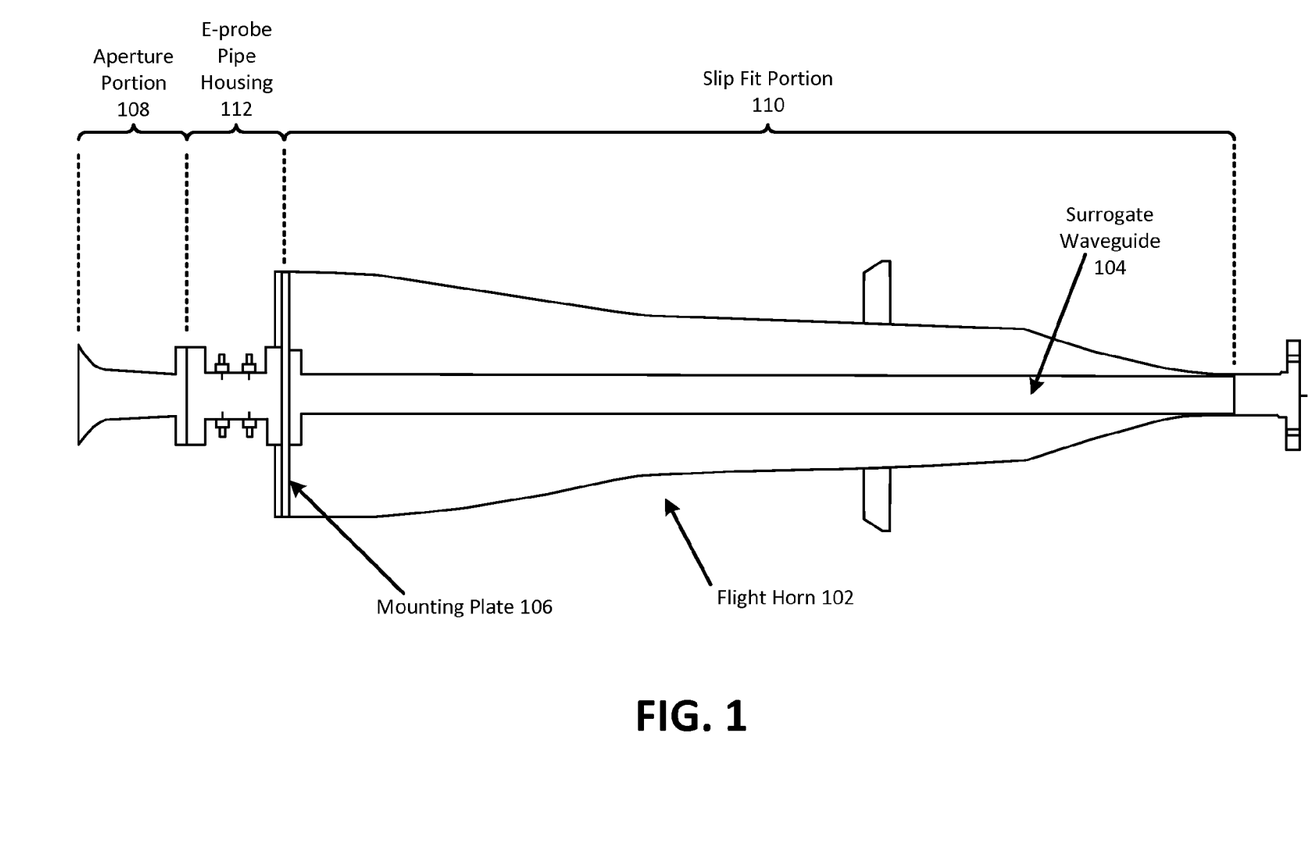
FIG. 1 illustrates a surrogate waveguide mounted in a horn antenna with an external E-probe.

FIG. 1 depicts an example apparatus used to test a microwave frequency payload. Flight horn 102 has a microwave frequency payload attached (but not depicted) and is the antenna connected to the payload being tested. If the payload being tested is for a satellite, flight horn 102 and its attached electronics will be sent into orbit on a satellite, while the other components depicted are used only during testing on the ground. The payload being tested, however, need not be part of a satellite for the disclosed examples to be a useful aid in testing; any payload with a horn antenna can be tested using the disclosed principles.

A surrogate waveguide 104 can be disposed in the flight horn 102, and is composed of several portions. The slip-fit portion 110 of a surrogate waveguide 104 can have one end slip-fit into the narrow end of the flight horn 102, and the other end of the slip-fit portion attached to a face plate or mounting plate 106 that is mounted to the aperture end (or wide end) of the flight horn 102. The mounting plate 106 has a hole in its center to form a thin portion of the surrogate waveguide 104. In this example, an E-probe housing 112 forms the next portion of the surrogate waveguide 104 and is attached directly to the outside of the mounting plate 106. Note, however, that an E-probe housing is not necessary for all test configurations that benefit from the reduced peak flux density. However, many modern satellites have many horn antennas and do not have internal test couplers designed into the spacecraft. An E-probe integrated into a surrogate waveguide is useful for testing such modern satellite systems. Details of the E-probe are provided below. The last portion of the surrogate waveguide 104 is the aperture portion 108 which at one end is attached to the E-probe housing in this example, and the other end is a flared aperture. The final aperture flare size is smaller than the aperture size of the flight horn 102. For example, a flight horn 102 designed for Ku-Band satellite communication may have a 5 inch aperture, while the aperture end of the surrogate waveguide may be 2 inches, leading to a reduction in peak flux density of approximately one-fifth the peak flux density without the surrogate waveguide.

While the interior surfaces of the Field Aperture Probe Coupler's transmission path (the portion that propagates microwave frequency energy) are bare metal such as aluminum, any or all of the exterior surface of the surrogate waveguide 104, mounting plate 106, coupler housing 112, aperture portion 108 may be coated with a highly thermally emissive material such as anodization or high temperature paint. The materials used to make many of the test apparatus elements can be thermally emissive, and many neighboring elements can be thermally coupled. For example, all portions of the surrogate waveguide 104 and the mounting plate 106 can be made from materials with high thermal emissivity and can all be thermally coupled to each. Anodized aluminum can be used to provide both thermal emissivity and electrical decoupling to prevent spurious electrical currents at contact points between the surrogate waveguide and the flight horn. In addition, an anodized layer can also preventing galling where neighboring parts rub against each other, such as where the surrogate waveguide 104 is slip-fit into the narrow end of the flight horn 102.

While a surrogate waveguide can have many shapes, such as circular or rectangular, only circular surrogate waveguides are depicted. The shape of a surrogate waveguide may be similar to the narrow end of the flight horn, and interior cross-sectional dimension of the surrogate waveguide may often be within a few percent of the interior cross-sectional dimension of the horn input waveguide where the slip-fit portion is mated to the flight horn in order to maintain a sufficient electrical match. The end of the slip-fit portion can be machined down until it is be very thin to help minimize difference in the dimensions, and matching rings or other elements can also be added to reduce coupling mismatch.

Figure 10:
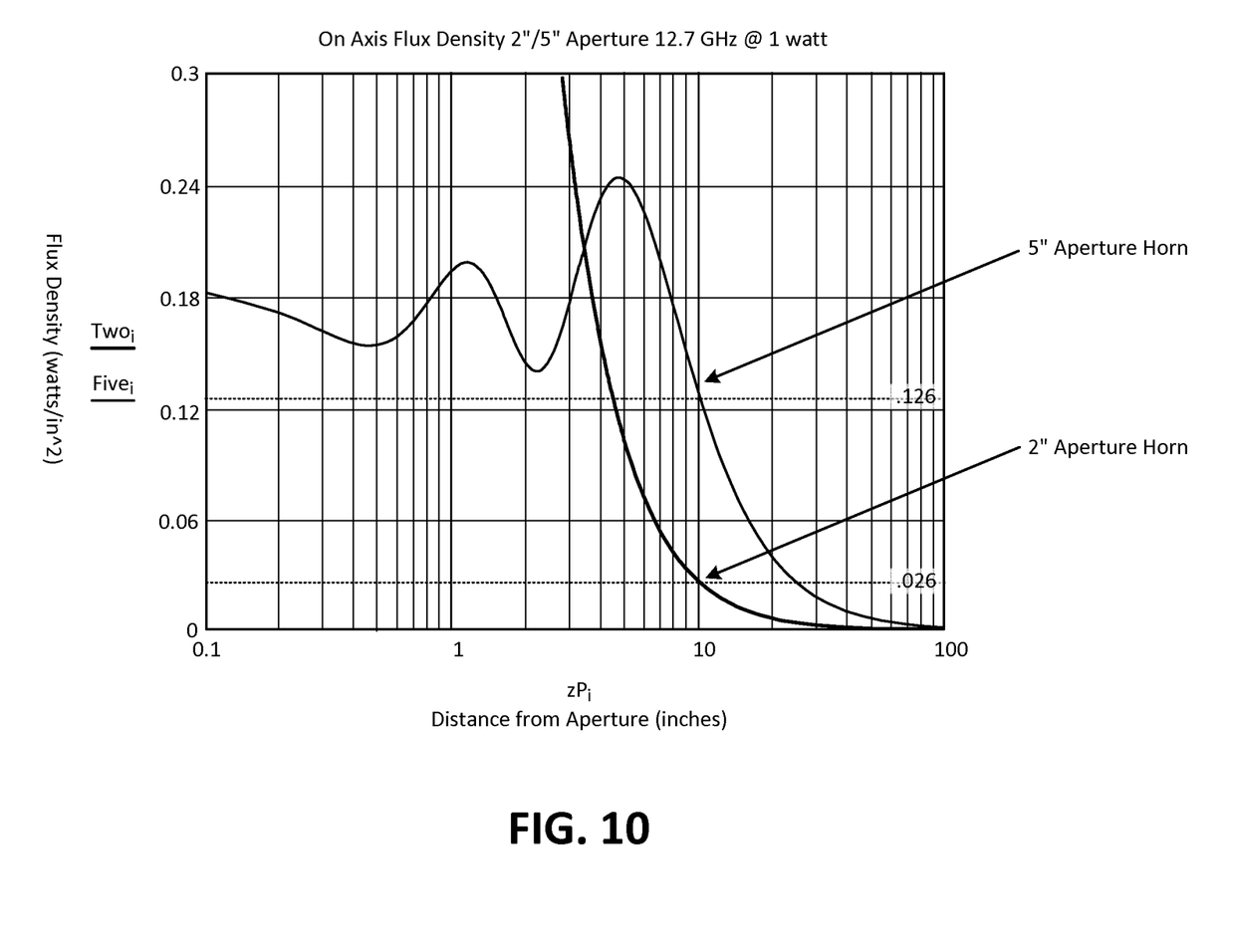
FIG. 10 illustrates the flux density difference between a 5" aperture flight horn and a 2" aperture surrogate waveguide.
Figure 11:
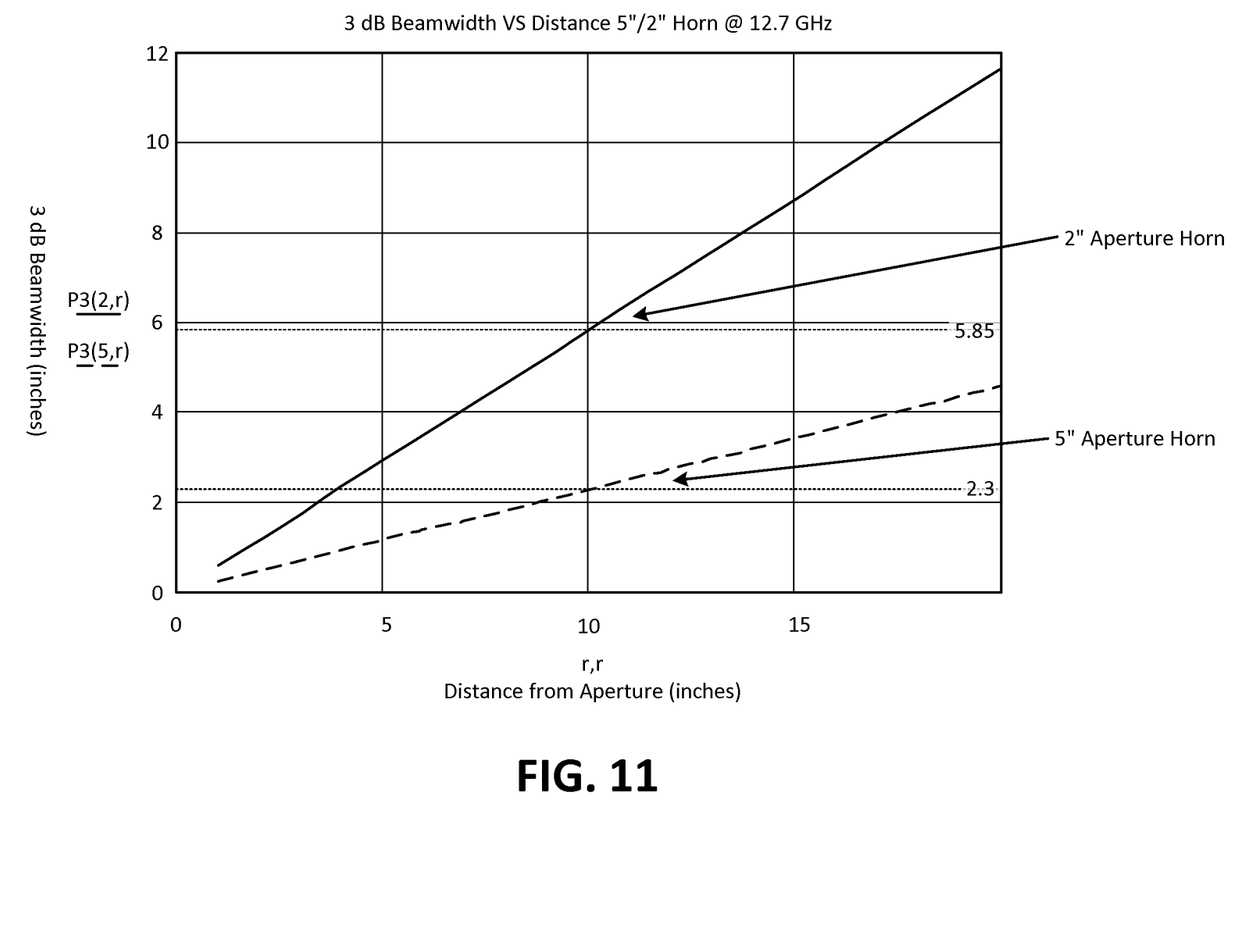
FIG. 11 illustrates the 3 dB beam width difference between a 5" aperture flight horn and a 2" aperture surrogate waveguide.

The benefits of a surrogate waveguide are demonstrated in the simulated test results in FIGS. 10 and 11. These figures are graphs showing differences between a 5" flight horn antenna and a 2" surrogate waveguide inserted into a 5" flight horn antenna. Benefits are shown at 10" from the flight horn aperture with a reference 1 watt transmitted at 12.7 GHz. FIG. 10 shows a 5" flight horn produces a simulated flux density of 0.126 watts/in^2, while the 2" surrogate waveguide produces only 0.026 watts/in^2. This is a reduction in flux density of almost 5 times at 10" from the horn by inserting the surrogate waveguide. FIG. 11 shows a related increase in beam width. At 10" from the flight horn aperture, the 3 dB beam width is 2.3" for the flight horn alone and 5.85" when the surrogate waveguide is inserted. This results in a 3 dB beam width spread over nearly 6.5 times the area with the surrogate waveguide as compared to the flight horn alone.

Figure 2:
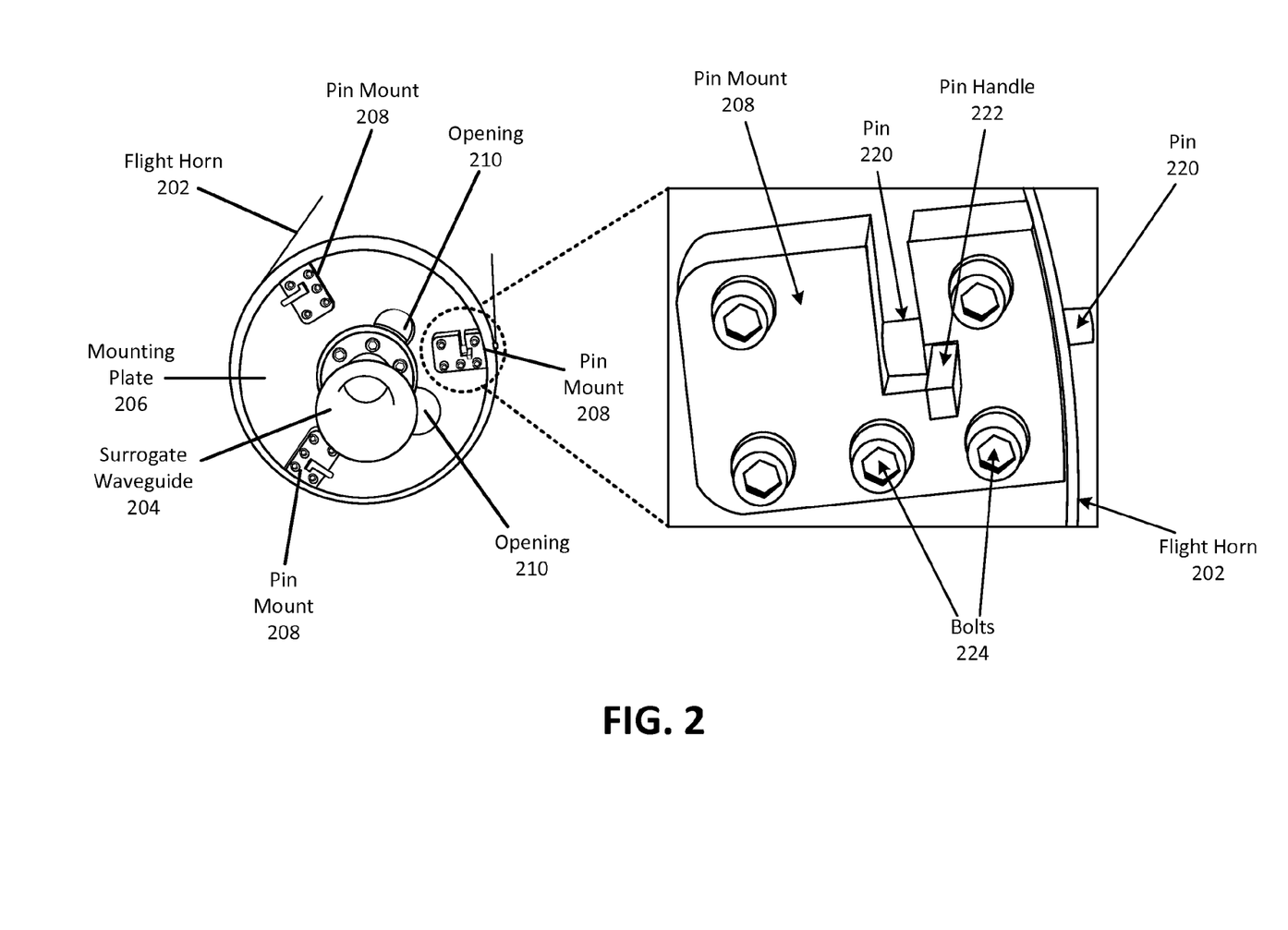
FIG. 2 illustrates a mounting plate used to mount a surrogate waveguide in a horn antenna.

FIG. 2 details an example of the mounting plate 106 from FIG. 1. The mounting plate 206 is mounted to flight horn 202 with three pins 220, each pin 220 in a pin mount 208. The pins insert into matched receiving holes in the flight horn 202 that are right next to the horn's aperture end. The three pin mounts 208 can be distributed unevenly around the circumference of the mounting plate (at positions somewhat greater and lesser than 120 degrees from each other) to ensure the mounting plate will mount in only one orientation. The pin mounts 208 can be affixed to the mounting plate 206 with bolts 224. Swiveling pins 220 can be disengaged or engaged with a matching receiving hole in the flight horn 202 by sliding the pin handle 222. It will be understood that many mechanisms for attaching a mounting plate 206 to a flight horn 202 exist, and these pins 220 and pin mounts 208 are just one example.

The center of the mounting plate 206 can have a hole with shape and dimension of the surrogate waveguide 104 and this forms a portion of the surrogate waveguide 104 along with other portions attached to either side of the mounting plate 206. The mounting plate 206 can have one or more additional openings 210 to allow any energy to leak out that might build up between the flight horn 202 and the outside of the surrogate waveguide. The diameter of the openings 210 may be greater than or equal to half the wavelength of signals being tested (large enough to be above cutoff) to allow the energy in those signals to leak out, but the number and size of the holes 210 should be small enough to prevent most of the energy reflected back at the horn from re-entering the horn. The openings 210 also allow for venting and cable routing, for example if the surrogate waveguide has a coupler inside the flight horn 202 (as depicted in FIG. 3).

Figure 3:
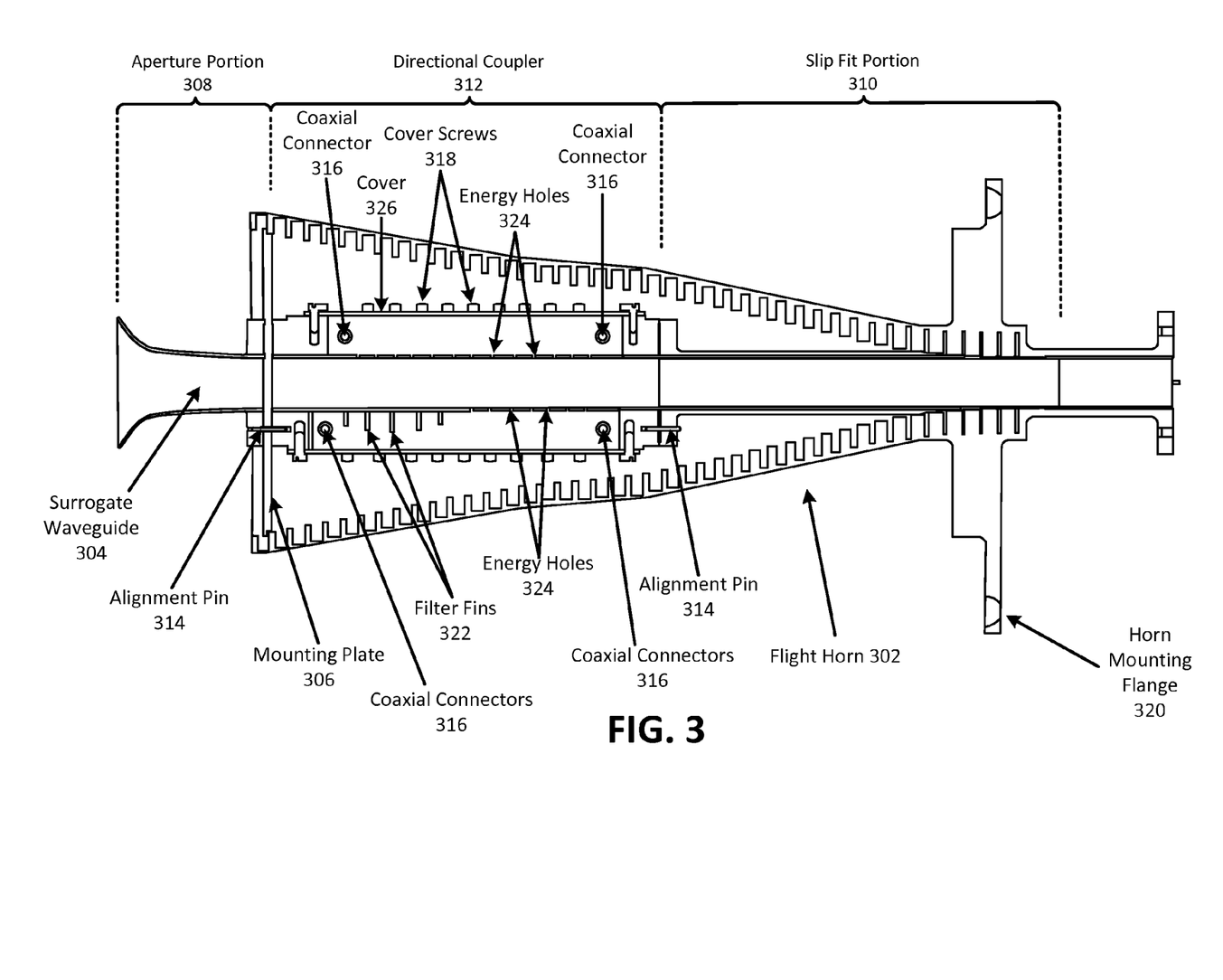
FIG. 3 illustrates a surrogate waveguide mounted in a horn antenna with an internal waveguide coupler.
Figure 4:
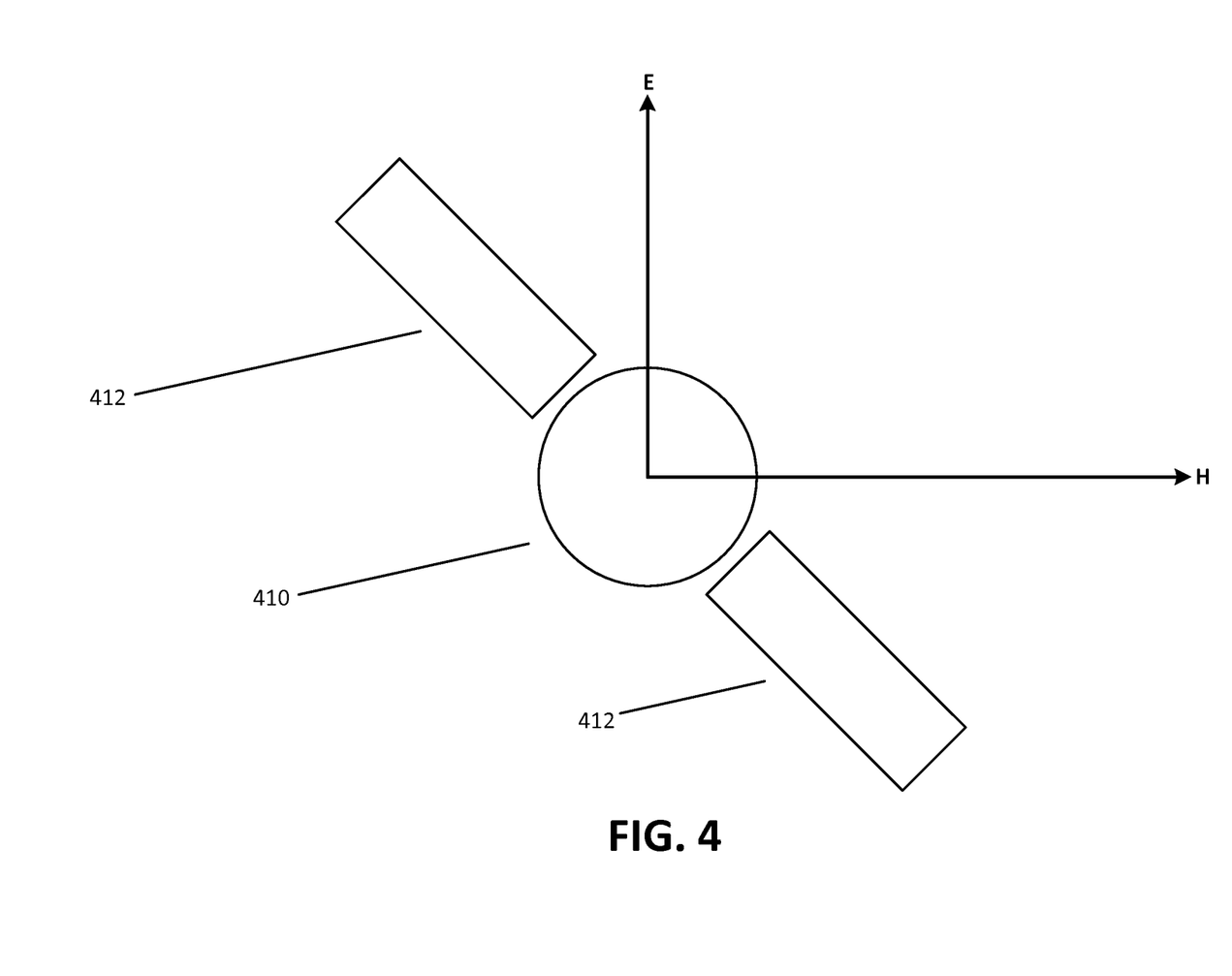
FIG. 4 illustrates a cross-sectional linear polarization orientation with respect to the waveguide coupler of FIG. 3.

FIG. 3 illustrates a surrogate waveguide 304 with a directional coupler that fits inside the flight horn 302 and mounting plate 306. In this example, the slip-fit portion 310 of the surrogate waveguide 304 is again slip-fit into the narrow waveguide end of the flight horn 302, but the other end of the slip-fit portion is attached to a directional coupler 312 portion of the surrogate waveguide, which then connects to the mounting plate 306, and then finally connects to the aperture portion 308 of the surrogate waveguide 304. Alignment pins 314 can ensure the separate portions of the surrogate waveguide are attached to each other in only one alignment, enabling careful alignment to, for example, certain polarizations of the electric field. The directional coupler 312 may be comprised of three aligned air spaces at a 45-degree angle relative to the electric and the magnetic field, as depicted in FIG. 4. The horn mounting flange 320 can be used for mounting the flight horn 302 to a satellite, and it will be understood that flange 320 may not exist in other examples, or may be of different shape or position as is appropriate for any particular application of a flight horn 302.

FIG. 4 shows a cross sectional view of the airspaces inside the directional coupler of FIG. 3. The central airspace 410 forms the portion of the surrogate waveguide 304 that runs through the middle of the directional coupler. As depicted in the examples of FIGS. 3 and 4, the surrogate waveguide 304 and corresponding airspace 410 may have a circular cross-section. Adjacent to, and aligned with, the central circular airspace 410 are two rectangular airspaces 412 that run along the directional coupler 312. The rectangular airspaces 412 can be on opposite sides of the central airspace 410, and aligned at a 45 degree angle from both the electric (E) and magnetic (H) fields of a single linear polarization, dual linear polarization, or circular polarization (CP) such that both electric and magnetic fields can be sampled, and test signals can be inserted into both fields.

Continuing the discussion of the directional coupler 312 in FIG. 3, coaxial connectors 316 allow for the sampling and inserting of signals. Cover 326 may form the outside wall of a rectangular airspace 412 and is attached to directional coupler 312 with cover screws 318. The other three sides of the rectangular airspaces 412 and the circular airspace 410 can be made by machining a single piece of aluminum. Energy holes 324 allow signal energy inside the surrogate waveguide 304 to leak into and out of the rectangular airspaces 412 for sampling and insertion with coaxial connector 316 field probes. Filter fins 322 can be tuned, for example, to couple in energy of the received signal while rejecting the energy of the transmitted signal.

Figure 5:
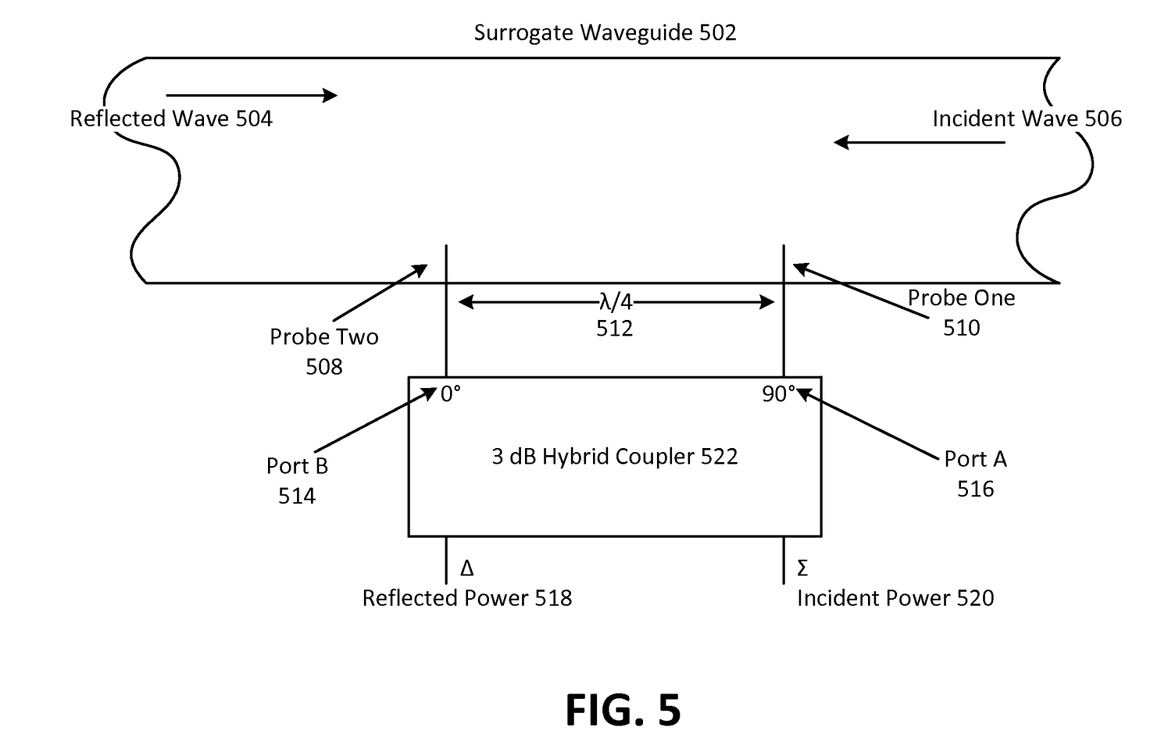
FIG. 5 illustrates a schematic of an E-probe directional coupler for FIG. 1.
Figure 6:
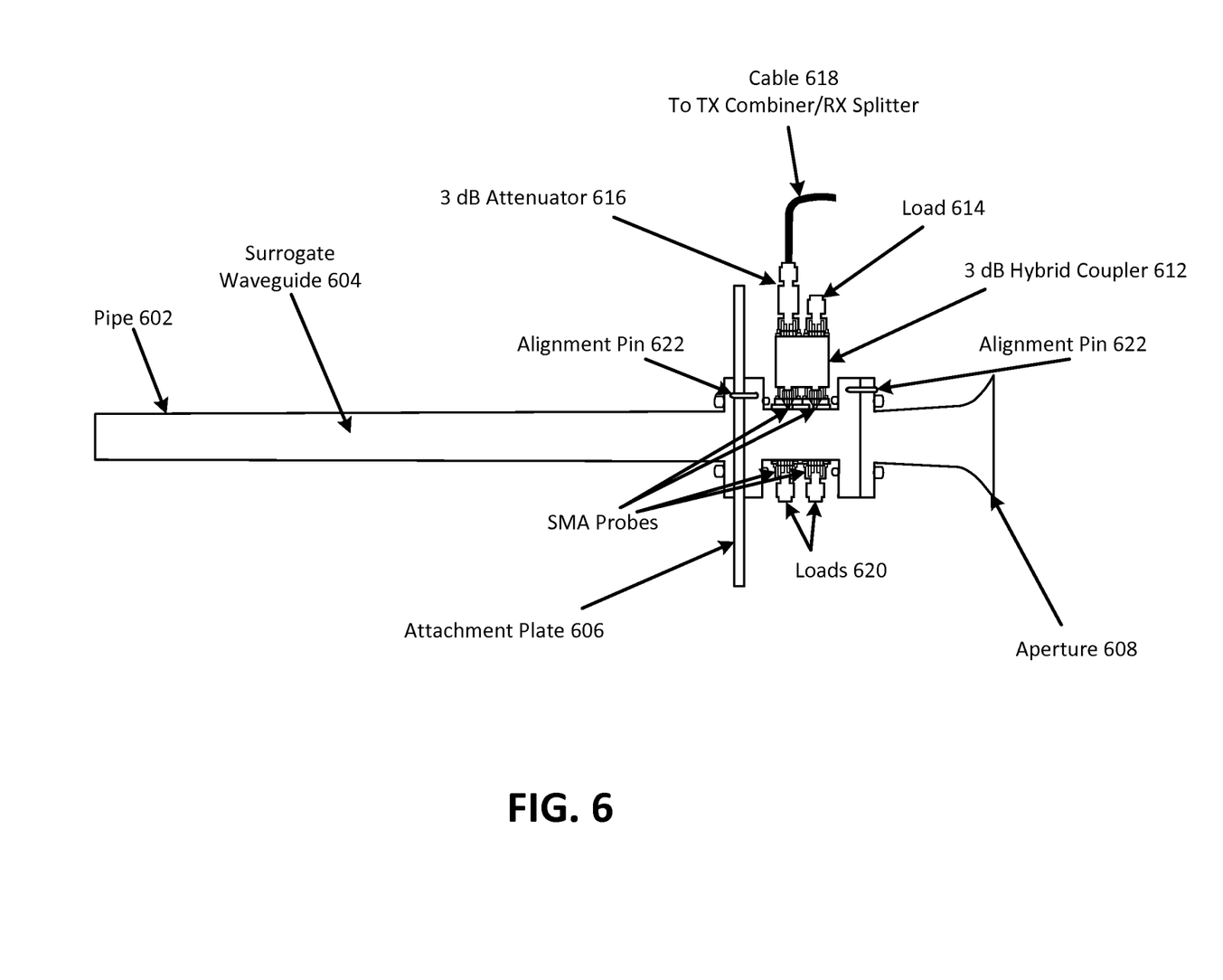
FIG. 6 illustrates a single-sided E-probe directional coupler.
Figure 7:
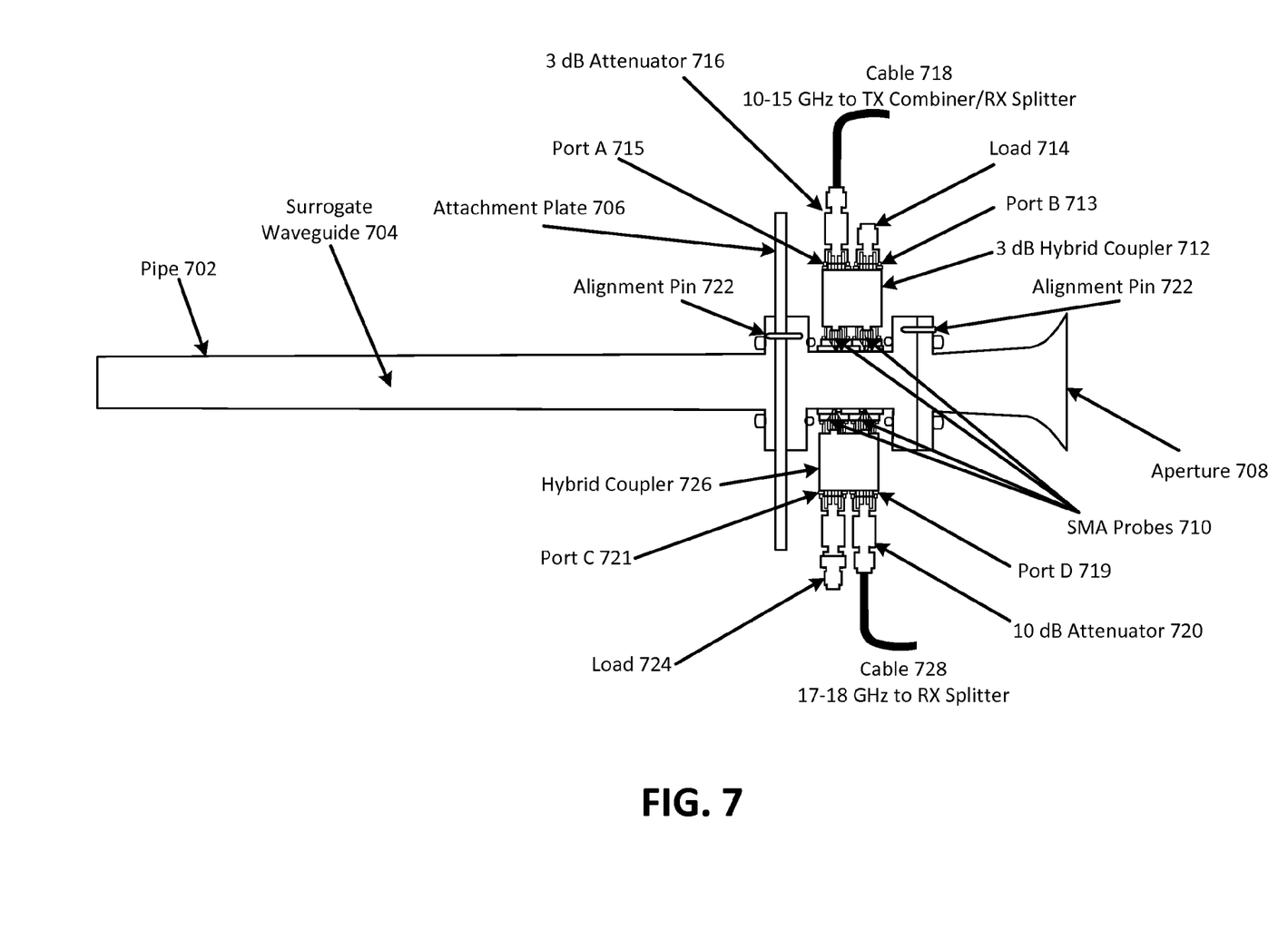
FIG. 7 illustrates a dual-sided E-probe directional coupler.

FIGS. 5, 6, and 7 provide details of some examples of an E-probe directional coupler attached to E-probe housing 112 from FIG. 1. FIG. 5 is a schematic of an E-probe directional coupler. The surrogate waveguide 502 has an incident wave 506 propagating from right to left while a reflected wave 504 propagates from left to right. These waves are sampled by probe one 510 and probe two 508 which are spaced at a distance 512 apart of one quarter of the circular waveguide wavelength at, for example, approximately 11 GHz. A delay equivalent to one quarter of a wavelength is added to probe one 510 through port A 516 by the internal phase shift of 90° of a 3 dB hybrid coupler 522 (such as a Krytar® 90° Hybrid Coupler). Probe two 508 through delay 512 equivalent to one quarter of a wavelength is directly connected to 0° port B 514 of the hybrid coupler 522. Incident wave 506 coupled by probe one 510 and probe two 508 both being delayed 90° arrive in phase and at the port for sum incident power 520. Reflected wave 504 couples directly to 0° port B 514 through probe two 508 and couples to 90° port A 516 through delay 512 equivalent to one quarter of a wavelength and arrive at the sum power port 520 180° out of phase with each other thereby canceling and providing directivity between incident and reflected power at sum port 520. Reflected and incident power sum and cancel respectively at port 518 in the same manner that the incident and reflected power sum and cancel respectively at sum port 520. Hybrid coupler 522 provides outputs for reflected power 518 and incident power 520.

FIG. 6 depicts a single-sided E-probe coupler configuration that can be effective with a 2 inch surrogate waveguide aperture and Ku band signals in the 10-15 GHz range. The surrogate waveguide 604 is formed from the pipe 602 through aperture 608. The pipe attaches to attachment plate 606 (or face plate or mounting plate), followed by attaching to the E-probe housing, and then the aperture 608. The E-probe housing has two pairs of SubMiniature version A (SMA) probes 610 on opposite sides of the surrogate waveguide 604. Each pair of SMA probes 610 can correspond to probe one 510 and probe two 508 in FIG. 5. This single-sided configuration has a 3 dB hybrid coupler 612 attached to one pair of SMA probes, with only loads 620 attached to the other pair for mode balancing. One port of the 3 dB hybrid coupler has a load attached, while the other port has a 3 dB attenuator to improve match, connected to a cable 618 with 10-15 GHz signals that leads to a transmit (TX) combiner/receive (RX) splitter. Alignment pins 622 enable rotational alignment of the E-probe housing and E-probe with, for example, with certain electric field polarizations.

FIG. 7 depicts a double-sided E-probe configuration that can be useful for both 10-15 GHz and 17-18 GHz Ku band signals. In this example, the surrogate waveguide 704 is formed from the same pipe 702, attachment plate 706, E-probe housing, and aperture 708 as in single sided configuration of FIG. 6. Here, however, there are two hybrid couplers attached to the two pairs of SMA probes 710 of the E-probe housing. The upper hybrid coupler is just like that of FIG. 6, and is a 3 dB hybrid coupler 712 with a load 714 attached to port B 713 and a 3 dB attenuator 716 attached to port A 715. Cable 718 is attached to 3 dB attenuator 716 and may again carry signals in the 10-15 GHz range for both transmit and receive. The lower hybrid coupler 726 is attached to the lower pair of SMA probes 710. Attached to port C 721 of the lower hybrid coupler 726 is a load 724, and attached to port D 719 is a 10 dB attenuator 720 with cable 728 containing the 17-18 GHz received signal. Alignment pins 722 enable rotational alignment of the E-probe housing and E-probes, for example, with certain electric field polarizations.

Alternate E-probe configurations are possible. For example, starting with the configuration of FIG. 7, and then removing load 714 and 3 dB attenuator 716, and assuming matched devices (with little reflection) attached to port A 715 and port B 713, then the 10-15 GHz frequency range will couple to port A 715 while the 15-18 GHz frequency range will couple to Port B 713. Such a dual-band mode for 3 dB hybrid coupler 712 may work because signals to and from the hybrid ports in the E-probe coupler begin to reverse direction at approximately 15 GHz where the spacing between the probes is approximately one half circular waveguide wavelength. The hybrid coupler port C 721 and port D 719 have reversed direction at receive frequency 17-18 GHz in this configuration due to the phase delay between probe one 508 and probe two 510 of FIG. 5, which is now approaching the three quarter circular waveguide wavelength at approximately 20 GHz. Port D 719 now sums incident power 506 and cancels reflected power 504 near 20 GHz, thus providing directivity at receive frequency 17-18 GHz. A similar alternate configuration can also be applied to the lower hybrid coupler 726 for a dual-band mode at Port C 721 and Port D 719.

Figure 8:
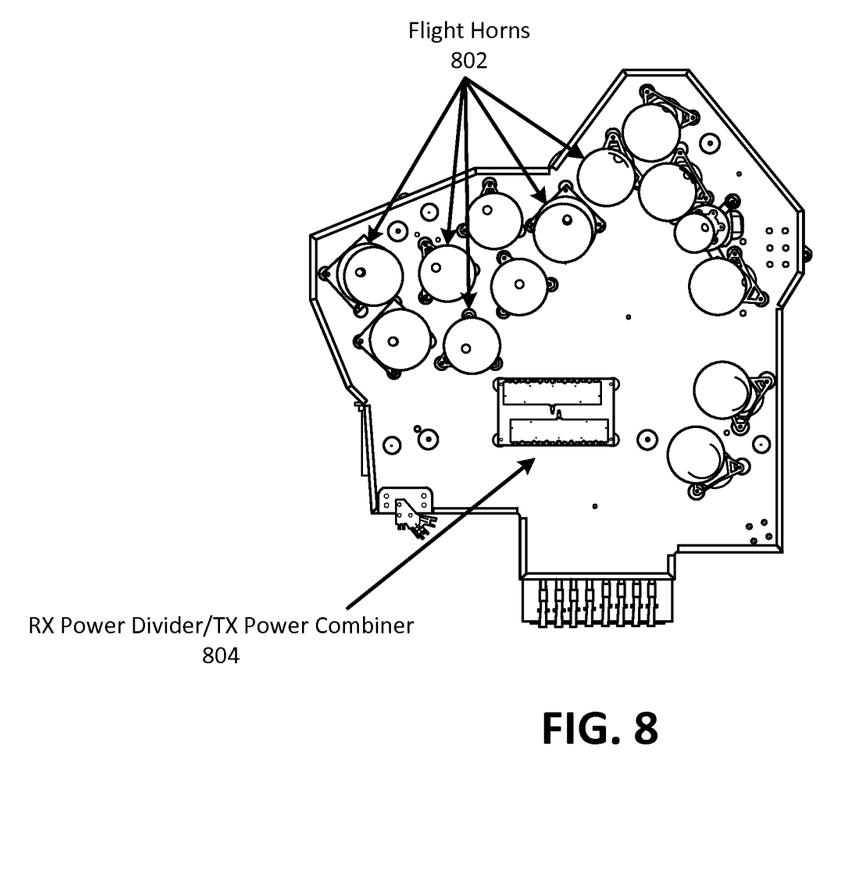
FIG. 8 illustrates a collection flight horns mounted on a satellite panel.
Figure 9:
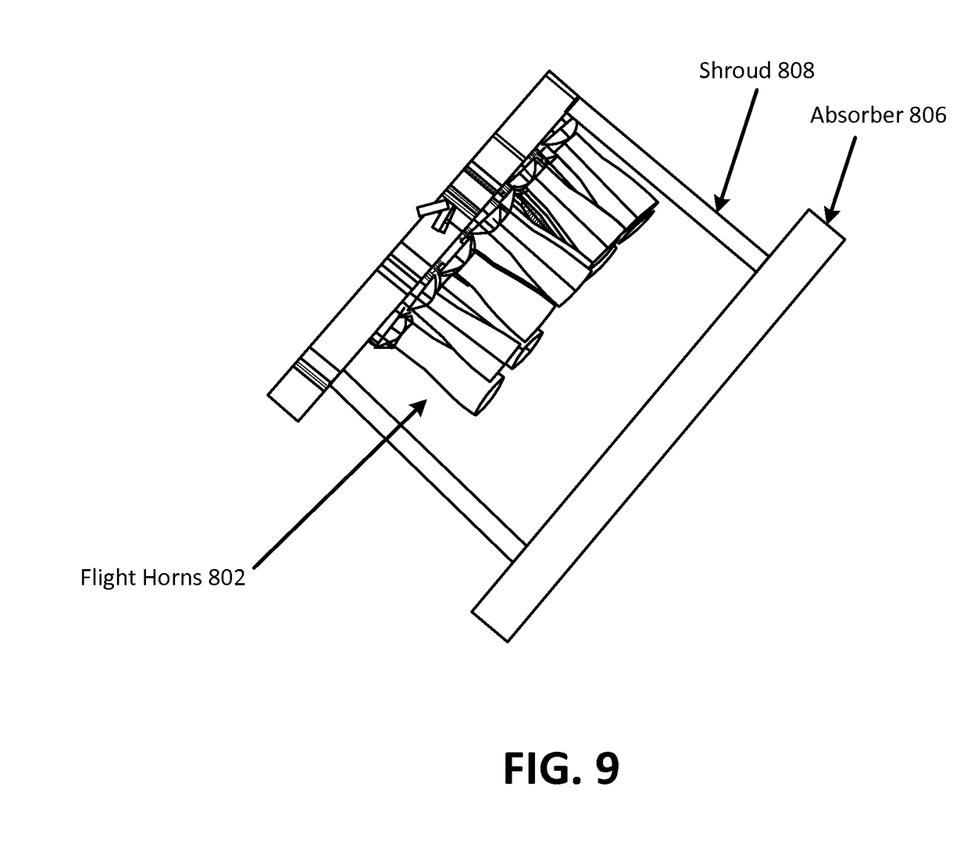
FIG. 9 illustrates an FAL test configuration for the flight horns of FIG. 8.

FIG. 8 depicts a group of flight horns as they might be arranged for a panel of a satellite. A satellite may have several such panels. In this panel, fourteen flight horns 802 are mounted together. Each of the horns can be fitted with a surrogate waveguide, for example as depicted in FIG. 1. Each surrogate waveguide may include an E-probe coupler, for example as depicted in FIG. 6. A 16:1 RX power divider/TX power combiner 804 can be temporarily mounted on the panel, and the cables from the E-probes can then be connected to power divider 804. Finally, as depicted in FIG. 9, all fourteen flight horns 802 with surrogate waveguides can be covered by a single a FAL test configuration (surrogate waveguides not shown). Such a test configuration may include an actively cooled RF absorbent pad 806 placed in front of flight horns 802 at approximately a 10° tilt from the direction of energy from the horns, and a shroud 808 surrounding all four sides and all fourteen flight horns 802.

While certain example embodiments have been described, these embodiments have been presented by way of example only, and are not intended to limit the scope of the disclosures herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the disclosures herein. The accompanying claims and their equivalents are intended to cover such forms or modifications as would fall within the scope and spirit of certain of the disclosures herein.

What is claimed is:

1. An apparatus adapted to reduce a peak radiated flux density of a horn antenna, comprising:
    a surrogate waveguide comprising:
        a first section having a first end configured to be disposed within a waveguide portion of the horn antenna;
        a second section having a second end configured to extend to or beyond a wide end of the horn antenna, wherein the second section of the surrogate waveguide comprises a flared aperture where the flare ends at or outside the wide end of the horn antenna and expands to a maximum cross-sectional dimension that is smaller than the largest cross-sectional dimension of the wide end of the horn antenna; and a face plate at and inside the wide end of the horn antenna through which the surrogate waveguide passes.

2. The apparatus of claim 1, wherein the surrogate waveguide has a circular or rectangular cross-section.

3. The apparatus of claim 1, wherein the face plate is perforated outside the surrogate waveguide with at least one hole having a diameter larger than half a wavelength of energy radiated by the horn antenna.

4. The apparatus of claim 1, wherein the surrogate waveguide is composed at least in part of hard anodized aluminum.

5. The apparatus of claim 1, wherein: the surrogate waveguide comprises an electric field probe (E-probe) directional coupler outside the horn antenna between the face plate and the second end.

6. The apparatus of claim 5, wherein the surrogate waveguide is aligned with a rotation such that the E-probe directional coupler is aligned to equally couple multiple polarizations of an electromagnetic field radiated by the horn antenna.

7. The apparatus of claim 5, wherein the E-probe directional coupler comprises:
two electric field probes spaced by an odd order quarter of a wavelength of a broadcast or received signal and aligned along a length of the surrogate waveguide; and
a 90° hybrid coupler attached to the two electric field probes where the electric field probes comprise connectors configured to equally couple multiple polarizations of electric field.

8. The apparatus of claim 1, wherein the surrogate waveguide comprises a multimode pipe coupler inside the horn antenna between the first section and the face plate, the multimode pipe coupler comprising:
a cylindrical waveguide aligned and centered along a center axis of the surrogate waveguide; and
two rectangular waveguides aligned and adjacent to the cylindrical waveguide, and positioned on opposite sides of the cylindrical waveguide to couple equally multiple polarizations of electric field.

9. The apparatus of claim 8, wherein the surrogate waveguide is aligned with a rotation such that pipe coupler is aligned to equally couple multiple polarizations of an electromagnetic field radiated by the horn antenna.

10. The apparatus of claim 1, wherein the length of the surrogate waveguide from the first end to at least the face plate has a uniform cross-sectional shape and dimension.

11. The apparatus of claim 1, further comprising a material and a coating on an outer portion of the surrogate waveguide, wherein the material and coating on the outer portion of the surrogate waveguide is thermally emissive and electrically decoupling.

12. The apparatus of claim 1, further comprising:
a radiation absorbing surface on an actively cooled aluminum plate surrounded by a thin aluminum shroud in a field aperture load configuration, where the radiation absorbing surface is positioned facing a primary direction of energy propagation from the front of the horn antenna.

13. A system for testing electronics associated with a horn antenna, comprising:
the horn antenna having a narrow end and an wide end;
a circular surrogate waveguide inserted into the horn with a straight end and an aperture end, wherein:
the surrogate waveguide is aluminum with an anodized exterior surface;
the straight end is slip-fitted into the narrow end of the horn;
the aperture end extends to or beyond the end of the wide end of the horn;
the diameter of the surrogate waveguide is constant from the narrow end near an exit of the wide end of the horn; and
the aperture of the aperture end of the surrogate waveguide is smaller than the aperture of the horn;
a mounting plate of anodized aluminum that:
is mounted at the wide end of the horn;
supports the surrogate waveguide which runs through the center of the mounting plate;
thermally couples with the surrogate waveguide; and
contains at least one perforation outside of the surrogate waveguide with diameter large enough to be above a cutoff for a signal generated by the horn; and
a radiation absorbing surface on an actively cooled aluminum plate surrounded by a thin aluminum shroud in a field aperture load configuration, where the radiation absorbing surface is positioned facing a primary direction of energy propagation from the front of the horn.

14. The system of claim 13, wherein the surrogate waveguide comprises an E-probe directional coupler outside the horn between the mounting plate and the aperture end, and wherein the E-probe comprises a 90° hybrid coupler.

15. The system of claim 13, wherein the surrogate waveguide comprises a multimode pipe coupler inside the horn between the straight end and the mounting plate, and the multimode pipe coupler comprises a cylindrical waveguide aligned and centered along the center axis of the surrogate waveguide with two rectangular waveguides aligned to the surrogate waveguide and positioned to equally couple multiple polarizations of electric field opposite each other and adjacent to the cylindrical waveguide.

16. A method for testing electronics associated with a horn antenna having a narrow end and a wide end, a surrogate waveguide with a straight end and an aperture end, the method comprising:
attaching the surrogate waveguide to the center of a mounting plate, wherein the shape and dimensions of the mounting plate are substantially the same as the shape and dimensions of the wide end of the horn, wherein the mounting plate comprises at least one perforation outside of the surrogate waveguide having a diameter that is above a cutoff for a signal generated by the horn;
inserting the surrogate waveguide into the horn until the straight end of the surrogate waveguide slip-fits into the narrow end of the horn;
attaching the mounting plate to the wide end of the horn; and
conducting one or more tests using a probe or directional coupler to detect or insert transmissions.

17. The method of claim 16, further comprising:
aligning the surrogate waveguide with a rotation such that a probe or directional coupler attached to the surrogate waveguide is aligned to equally couple multiple polarizations of an electromagnetic field radiated by the horn.

18. The method of claim 16, further comprising:
positioning a radiation absorbing pad in a path of radiation from the aperture end of the surrogate waveguide.

19. The method of claim 18, further comprising:
surrounding a portion of the space between the radiation absorbing pad and the aperture end of the surrogate waveguide with a conductive metal shroud in a field aperture load configuration.

20. The method of claim 16, wherein the conducting comprises sampling or inserting a first signal in a first frequency range at a first port of a hybrid directional coupler, and sampling or inserting a second signal in a second frequency range at a second port of the hybrid directional coupler.

\* \* \* \* \*